US009042180B2

(12) United States Patent
Tanzawa et al.

(10) Patent No.: US 9,042,180 B2
(45) Date of Patent: May 26, 2015

(54) CHARGE PUMP REDUNDANCY IN A MEMORY

(75) Inventors: Toru Tanzawa, Tokyo (JP); Tomoharu Tanaka, Yokohama (JP)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 13/995,166

(22) PCT Filed: Mar. 25, 2012

(86) PCT No.: PCT/US2012/030489
§ 371 (c)(1),
(2), (4) Date: Jun. 17, 2013

(87) PCT Pub. No.: WO2013/147727
PCT Pub. Date: Oct. 3, 2013

(65) Prior Publication Data
US 2014/0029346 A1    Jan. 30, 2014

(51) Int. Cl.
*G11C 16/30* (2006.01)
*G11C 5/14* (2006.01)
*G11C 29/00* (2006.01)

(52) U.S. Cl.
CPC ............... *G11C 16/30* (2013.01); *G11C 5/145* (2013.01); *G11C 29/702* (2013.01)

(58) Field of Classification Search
None
See application file for complete search history.

(56) References Cited

U.S. PATENT DOCUMENTS

| | | | |
|---|---|---|---|
| 4,685,197 A * | 8/1987 | Tigelaar et al. | 438/386 |
| 5,740,111 A | 4/1998 | Duesman | |
| 6,774,667 B1 | 8/2004 | Chan | |
| 6,980,045 B1 | 12/2005 | Liu | |
| 2004/0046603 A1 | 3/2004 | Bedarida et al. | |
| 2010/0072816 A1* | 3/2010 | Kenkare et al. | 307/24 |

FOREIGN PATENT DOCUMENTS

WO    WO-2013147727    10/2013

OTHER PUBLICATIONS

TPS60111 (Texas Instrument Charge Pump Specification, 1999, p. 5).*
Dickenson, "On-Chip High Voltage Generation in MNOS Integrated Circuits Using an Improved Voltage Multiplier Technique", IEEE Journal of Solid-State Circuits, vol. SC-11, No. 3, Jun. 1976, pp. 374-378.
International Search Report and Written opinion for PCT Patent Application No. PCT/US2012/030489, mailed on Nov. 14, 2012, 9 Pages.
Tanzawa, et al., "Circuit Techniques for a 1.8-V-Only NAND Flash Memory", IEEE Journal of Solid-State Circuits, vol. 37, No. 1, Jan. 2002, pp. 84-89.
Umezawa, et al., "A 5-V-Only Operation 0.6-μm Flash EEPROM with Row Decoder Scheme in Triple-Well Structure", IEEE Journal of Solid-State Circuits, vol. 27, No. 11, Nov. 1992, pp. 1540-1546.

* cited by examiner

*Primary Examiner* — James G Norman
(74) *Attorney, Agent, or Firm* — Alpine Technology Law Group LLC

(57) ABSTRACT

An integrated circuit includes a circuit block to utilize a load current at a load voltage from a power input and two or more charge pump arrays. The outputs of the charge pump arrays are coupled to the power input of the circuit block. The integrated circuit includes one or more modifiable elements to disable one or more of the two or more charge pump arrays.

25 Claims, 5 Drawing Sheets

CHARGE PUMP REDUNDANCY IN A MEMORY

BACKGROUND

1. Technical Field

The present subject matter generally relates to semiconductor integrated circuits, and more particularly, to charge pump arrays in memory devices utilizing three-dimensional circuit techniques.

2. Background Art

Certain semiconductor integrated circuits (ICs), including certain types of memory devices, may include charge pump arrays to create voltages for internal use that are different than the voltages provided at the power inputs of the IC. Various designs for charge pump arrays are well known in the art and may include capacitors to store charge at different stages within the charge pump arrays. Additional capacitors may be used as bypass capacitors on the output of the charge pump array to reduce noise on the output. In some cases, multiple charge pump arrays may be ganged in parallel, with their outputs coupled together, to provide higher current capability and multiple bypass capacitors may also be included in parallel to increase the capacitance on the ganged charge pump array outputs. Higher currents may lead to higher values of capacitance in the capacitors in the charge pump arrays and/or the bypass capacitors.

Some ICs, including dedicated memory devices, include blocks of memory cells. While traditional memory devices organize the cells in a two dimensional array, some devices may build a three dimensional array of cells. In some three dimensional flash memories, a NAND string may be built vertically, stacking the individual field-effect transistors (FETs) of the string on top of each other, so that the string extends out from the substrate. Such architectures may provide for very high bit densities in a flash memory device. A side-effect of these large three dimensional structures is that capacitance of the control lines may be higher than those of many two dimensional memory structures. The higher capacitance of the control lines may lead to higher current drawn from the charge pump arrays in the IC, in some cases.

BRIEF DESCRIPTION OF THE DRAWINGS

The accompanying drawings, which are incorporated in and constitute part of the specification, illustrate various embodiments. Together with the general description, the drawings serve to explain different principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1:
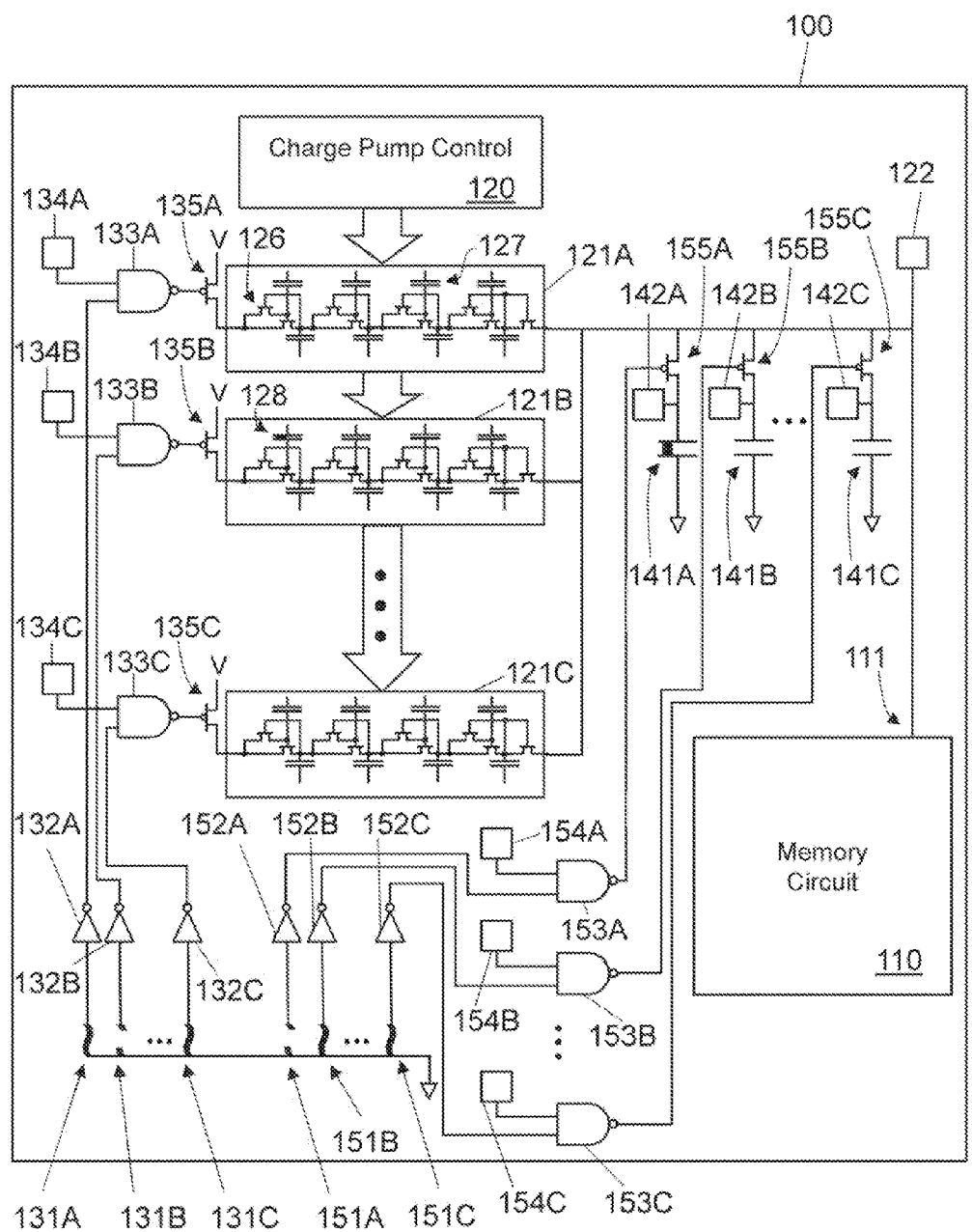
FIG. 1 is a block diagram of an embodiment of an integrated circuit with redundant charge pump arrays and redundant bypass capacitors.

FIG. 1 is a block diagram of an embodiment of an integrated circuit 100 with redundant charge pump arrays 121A-C and redundant bypass capacitors 141A-C. The integrated circuit (IC) 100 may include a memory circuit 110 in some embodiments, which may utilize a two-dimensional or three-dimensional array of memory cells. The memory circuit 110 may have a power input 111 that may be used for certain functions in the memory circuit 110 such as writing/programming, erasing, and/or reading memory cells in the memory circuit 110. The power input 111 may utilize a different voltage than the voltages provided directly to the IC 100 and may be generated by two or more charge pump arrays 121A-C.

A charge pump control circuit 120 may generate various control signals to the charge pump arrays 121A-C in some embodiments, although other embodiments may provide individual control circuits for the individual charge pump arrays 121A-C. Various circuits for charge pump arrays are well known in the art and the particular circuit design shown for charge pump arrays 121A-C is for exemplary purposes, and should not be interpreted as limiting this disclosure in any way. The charge pump arrays 121A-C may include transistors such as the field effect transistor (FET) 126, and capacitors such as capacitor 127. Any number of charge pump arrays 121A-C greater than or equal to two, may have their outputs coupled together so that the charge pump arrays 121A-C may operate in parallel. This allows the current of the individual charge pump arrays 121A-C to be combined at the coupled output so that the memory circuit 110 can utilize a load current at a load voltage from the power input 111. The coupled output may also be connected to test point 122.

An individual charge pump array 121A may have a design capability to provide at least a target current at the load voltage. Design capability means that if all the components of the charge pump array 121A are operating to their design specifications and are interconnected as designed, the charge pump array 121A may provide at least the target current at the load voltage. If one or more of the components of the charge pump array 121A, such as FET 126 or capacitor 127, are not operating at their design specification due to a defect caused by the materials, manufacturing process, environmental factors, electro-static discharge (ESD), or other causes, the charge pump array 121A may not be able to provide the target current at the load voltage.

The higher current levels that may be used by modern circuits, such as very large memory arrays, including three-dimensional memory arrays, may increase the number of charge pump arrays 121A-C that are included in the IC 100 and/or may increase the target current output for individual charge pump arrays 121A-C. Increased target current may lead to designs with capacitors having higher capacitance in the charge pump arrays 121A-C, such as capacitor 127. In some embodiments, multi-layer capacitors having multiple layers of a conductor, such as polysilicon, with interleaved layers of an insulator, such as silicon oxide, may be used to provide higher capacitance in a smaller footprint. Examples of multi-layer capacitors may be seen in FIG. 3B-D. Three-dimensional circuit techniques such as those used for three-dimensional memory arrays may be useful in constructing multi-layer capacitors.

One problem that may arise with multi-layer capacitors is a higher rate of defects due to the large total area of the plates of the capacitor. This higher level of defects may cause a higher than acceptable percentage of charge pump arrays 121A-C to be defective, or not able to provide the target current at the load voltage. To mitigate the effects of the higher defect rate for the capacitors, redundant charge pump arrays 121A-C are included in the IC 100. Redundant means that if one or more charge pump arrays 121B are defective, the remaining non-defective charge pump arrays 121A, 121C have the capability to provide the load current at the load voltage to the memory circuit 110. As an example, if the load current is 1 milliampere (mA) at a load voltage of 10 volts (V), and an individual charge pump array 121A has a design capability to provide a target current of 500 micro-amperes (μA) at 10V, two charge pump arrays would be capable of providing the load current of 1 mA. In various embodiments, one or more additional charge pump arrays may be included in the IC 100, so that three or more charge pump arrays are included in the IC 100. Embodiments may include more than one redundant charge pump array, depending on the expected defect rate and target yield. With redundant charge pump arrays, a defective charge pump array may be disabled in some embodiments, to reduce power consumption or to avoid interfering with the proper operation of the other charge pump arrays. For determining the number of charge pump arrays that should be enabled and/or may be disabled, calculations may be performed using peak and/or average target current and load current, depending on the embodiment.

Modifiable elements 131A-C are included in the IC 100 to disable or enable charge pump arrays 121A-C. Various testing methods may be used to determine which charge pump arrays 121A-C to disable an which charge pump arrays 121A-C to enable, such as the method shown in FIG. 5 which is discussed later. The modifiable elements may be fuse links 131A-C as shown in FIG. 1, or may be bonding wires, micro-electro-mechanical switches (MEMS), laser etchable conductors, non-volatile memory cells, or any other type of non-volatile element in other embodiments.

In the example embodiment shown in FIG. 1, charge pump array 121B has a defective capacitor 128 that may cause the charge pump array 121B to be unable to provide the target current at the load voltage. Once it has been determined that the charge pump array 121B is defective, fuse link 131B may be blown, or made into an open circuit, to disable the charge pump array 121B. Fuse link 131A and fuse link 131C may be left intact to enable charge pump array 121A and charge pump array 121C. Various circuits may be used to disable or enable a charge pump array based on the modifiable elements, but in the embodiment shown, the fuse links 131A-C may be used to couple an input of an inverter 132A-C to ground if the respective fuse link 131A-C is intact. The design of the inverters 132A-C may be such that an open input is interpreted as a high input, so the output of inverter 132B is low while the outputs of inverter 132A and 132C are high. The inverters 132A-C are coupled to NAND gates 133A-C along with test pads 134A-C which may be useful for some testing methods. The outputs of NAND gates 133A-C are then coupled to FETs 135A-C that may determine whether the charge pump arrays 121A-C are provided a power input. The output of NAND gate 133A is low, turning FET 135A on, and providing power to the charge pump array 121A, thereby enabling charge pump array 121A. Likewise, the output of NAND gate 133C is low, turning FET 135C on, and providing power to the charge pump array 121C, thereby enabling charge pump array 121C. But because the fuse link 131B is open, the output of inverter 132B causes the output of NAND gate 133B to be high, which turns off FET 135B, thereby depriving the charge pump array 121B of power and disabling charge pump array 121B.

Some embodiments of IC 100 may include redundant bypass capacitors 141A-C. The bypass capacitors may be multi-layer capacitors and may have a higher defect rate due to the total area of the plates of the capacitors 141A-C. A total amount of desired bypass capacitance may be calculated, and enough bypass capacitors 141A-C included in the IC 100 that one or more of the bypass capacitors 141A-C may be decoupled from the coupled outputs of the charge pump arrays 121A-C, while still leaving enough bypass capacitors 141A-C coupled to the coupled outputs of the charge pump arrays 121A-C to provide the desired amount of capacitance. Additional modifiable elements 151A-C may be included in the IC 100 to determine which bypass capacitors 141A-C may be used. The modifiable elements 151A-C may be fuse links as shown, or may be any other type of modifiable element such as those described above, and may be the same type or different type of modifiable element as those used for modifiable elements 131A-C. Some embodiments may use a combination of various types of modifiable elements for modifiable elements 131A-C and modifiable elements 151A-C and may even use different types of modifiable elements within one group of modifiable elements.

Various circuits may be used in embodiments to couple or decouple the bypass capacitors 141A-C to the coupled outputs of the charge pump arrays 121A-C based on the modifiable elements 151A-C. The circuitry may include circuitry for testing purposes such as test pads 154A-C and/or test pads 142A-C. In IC 100, bypass capacitor 141A is defective and fuse link 151A is blown to decouple the bypass capacitor 141A from the coupled outputs of the charge pump arrays 121A-C. The blown fuse link 151A allows the input of inverter 152A to be high so that the output of the inverter 152A drives an input of NAND gate 153A low. The high output of NAND gate 153A turns off FET 155A, decoupling bypass capacitor 141A from the coupled outputs of the charge pump arrays 121A-C. Intact fuse links 151B-C couple the input of their respective inverters 152B-C to ground, thereby driving an input of the respective NAND gate 153B-C high. Because the test pads 142B-C are floating, which may be interpreted by the NAND gates 153B-C as high inputs, the outputs of NAND gates 153B-C are then low, turning on FETS 155B-C and coupling bypass capacitors 141B-C to the coupled outputs of the charge pump arrays 121A-C.

Figure 2A:
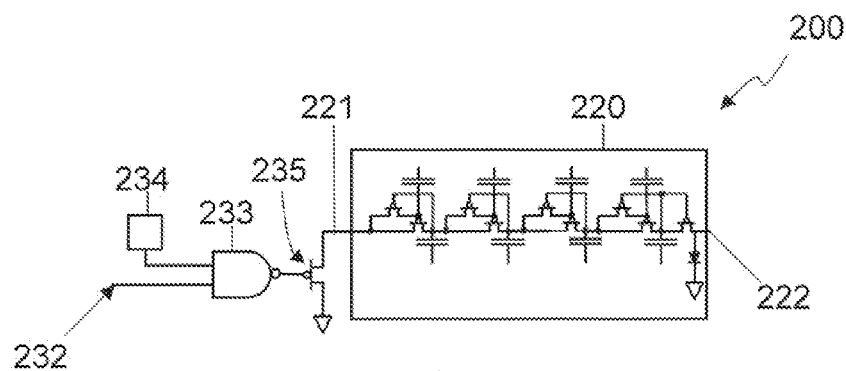
FIGS. 2A and 2B are block diagrams of alternative embodiments of charge pump arrays with disabling circuitry.

FIG. 2A is a circuit diagram of an alternative embodiment of a charge pump array with disabling circuitry 200. The charge pump array 220 is of a design to produce a negative voltage at its output 222. To disable the charge pump array 220, the input 221 may be left floating. To accomplish this, a NAND gate 233 may be coupled to a FET 235 to selectively couple the input 221 to ground. The inputs of the NAND gate 233 may be driven by a test input 234 and an input signal 232 that may be derived from a modifiable element to determine whether or not to enable the charge pump array 220.

Figure 2B:
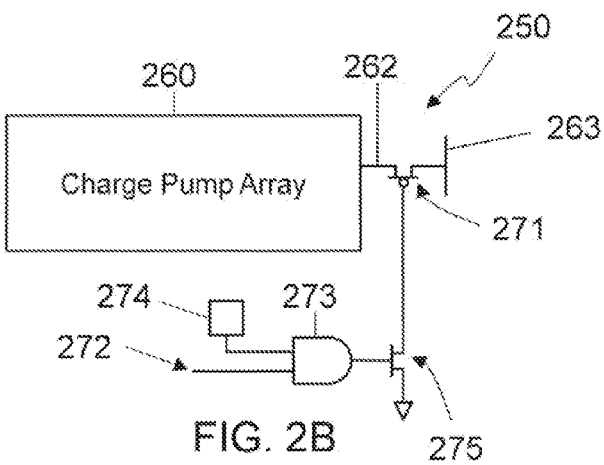

FIG. 2B is a circuit diagram of another alternative embodiment of a charge pump arrays with disabling circuitry 250. In FIG. 2B, the charge pump array 260 may be of any design producing a positive voltage at its output 262. In the embodiment of FIG. 2B, output 262 of the charge pump array 260 is selectively coupled to other charge pump array outputs 263. If the charge pump array 260 is decoupled from the other charge pump array outputs 263, it may be referred to as being disabled. To disable the charge pump array 260, a pass transistor, FET 271, may be used. The gate of FET 271 may be coupled to the source of FET 275. An AND gate 273 may be coupled to a FET 275 to selectively couple the gate of FET 271 to ground, thereby turning off FET 271 and decoupling the output 262 from the other outputs 263. The inputs of the AND gate 273 may be driven by a test input 274 and an input signal 272 that may be derived from a modifiable element to determine whether or not to enable the charge pump array 220.

Other embodiments may use other circuitry to disable a charge pump array. Some embodiments may disable the charge pump array by not driving the control lines of the charge pump array instead of, or in addition to, decoupling input power or decoupling the output. Some charge pump arrays may have an additional disable input that may utilize other internal design features of the charge pump array to disable the charge pump array. A charge pump array may be referred to as disabled as long as the charge pump array is prevented from contributing current to the load, whether or not the charge pump array is connected to the load, and whether or not the charge pump array is operating.

Figures 3A, 3B:
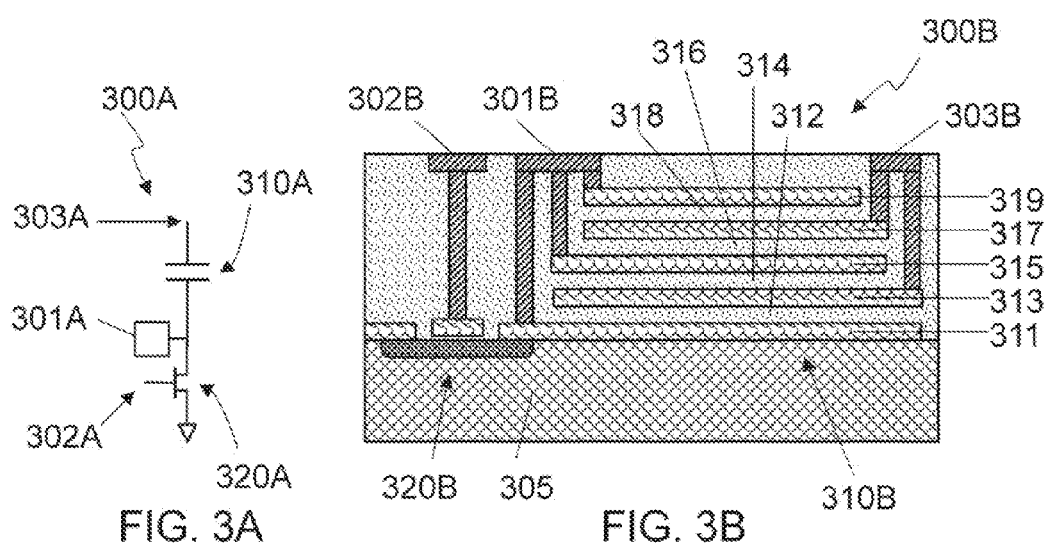
FIG. 3A is a circuit diagram of an alternative embodiment of a capacitor with decoupling circuitry.
FIGS. 3B, 3C and 3D are cross-sectional side views of embodiments of the capacitor and decoupling circuitry of FIG. 3A.

FIG. 3A is a circuit diagram of an alternative embodiment of a capacitor with decoupling circuitry 300A. A capacitor 310A, which may be a multi-layer capacitor, has a terminal 303A that may be coupled to the output of at least one charge pump array. The other terminal of the capacitor 310A may be coupled to a test pad 310A and to FET 320A. FET 320A may have a gate 302A that may be driven high to couple the capacitor 310A to ground, thereby coupling the capacitor 310A to the output of the at least one charge pump array. If the gate 302A is pulled low, the FET 320A is turned off, allowing the capacitor to float with the output of the at least one charge pump array, thereby effectively decoupling the capacitor 310A from the output of the at least one charge pump array.

Embodiments may use various circuits to couple a bypass capacitor to at least one output of a charge pump array, instead of, or in addition to, the circuits shown in FIG. 1 and FIG. 3A. A bypass capacitor may be referred to as coupled to an output of at least one charge pump array if one terminal of the capacitor is coupled to the output and the other terminal of the capacitor is coupled to ground or a line held at some other relatively constant voltage level. If one terminal of the bypass capacitor is floating, the capacitor may be thought of as being decoupled, even if the other terminal is coupled to an output of at least one charge pump array.

FIG. 3B is a cross-sectional side view of an alternative embodiment of a capacitor with decoupling circuitry 300A shown in FIG. 3A. The cross-sectional side view is of a portion of an IC utilizing three dimensional circuit techniques such as might be used in a three-dimensional memory array structure. The circuitry 300B may be created on a substrate 305 with the FET 320B built conventionally with a doped well, polysilicon contacts for the source and drain, and a polysilicon gate isolated from the doped well by a thin layer of oxide. The gate of the FET 320B may be brought to a metal line 302B that may be routed to other control circuitry and the source of FET 320B may be coupled to the metal test pad 301B.

The multi-layer capacitor 310B may include multiple layers of polysilicon and oxide. In the embodiment shown, polysilicon layer 311 is coupled to the source of FET 320B and test pad 301B as well as polysilicon layer 315 and polysilicon layer 319. The output line 303B is coupled to polysilicon layer 313 and polysilicon layer 317 to constitute the other terminal of capacitor 310B. Oxide layers 312, 314, 316, 318 isolate the adjacent polysilicon layers. Other embodiments may use various materials for the capacitor. Some embodiments may use metal or other conductive materials in addition to, or in place of the polysilicon and some embodiments may use nitride or other insulating material in addition to, or in place of the oxide. A capacitor may be referred to as a multi-layer capacitor if at least three stacked layers of conductive material, separated by at least two layers of insulating material are used in the capacitor.

Figure 3C:
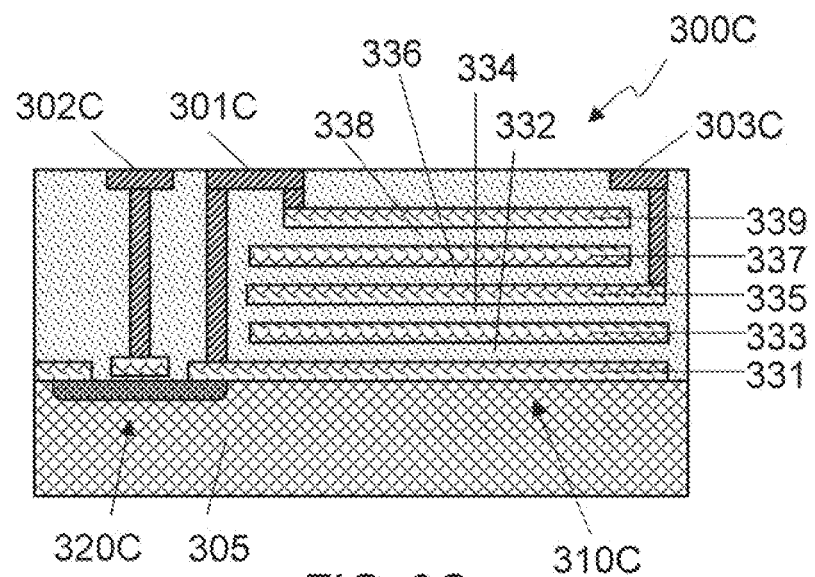

FIG. 3C is a cross-sectional side view of another alternative embodiment of a capacitor with decoupling circuitry 300A shown in FIG. 3A. The cross-sectional side view is of another portion of an IC utilizing three dimensional circuit techniques such as might be used in a three-dimensional memory array structure. The circuitry 300C may be created on the substrate 305 with the FET 320C built conventionally and coupled to metal line 302C and metal test pad 301C.

Figure 3D:
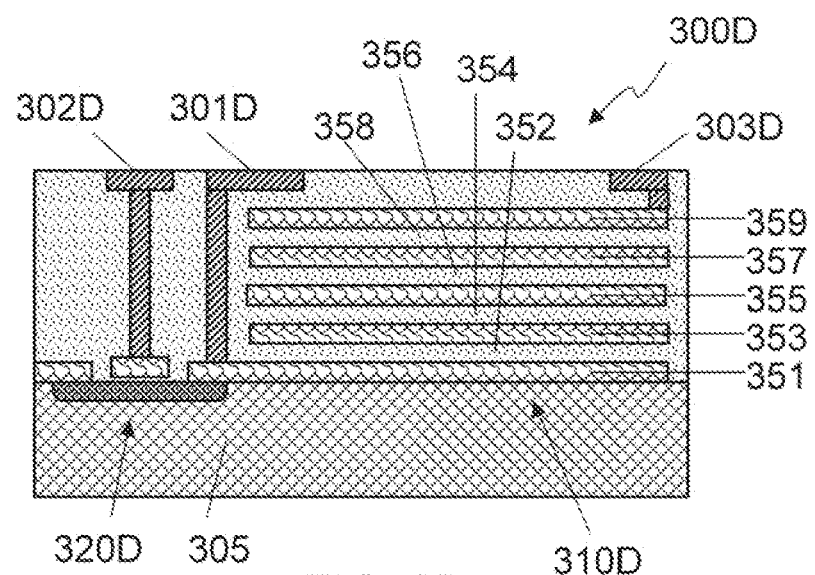

The multi-layer capacitor 310C may include multiple layers of polysilicon and oxide. In the embodiment shown, polysilicon layer 331 is coupled to the source of FET 320C and test pad 301C as well as polysilicon layer 339. The output line 303C is coupled to polysilicon layer 335 constituting the other terminal of capacitor 310C. Polysilicon layers 333 and 337 are left floating to increase time dependent dielectric breakdown (TDDB) by effectively increasing the thickness of the dielectric of the capacitor 310C. Oxide layers 332, 334, 336, 338 isolate the adjacent polysilicon layers FIG. 3D is a cross-sectional side view of yet another alternative embodiment of a capacitor with decoupling circuitry 300A shown in FIG. 3A. The cross-sectional side view is of another portion of an IC utilizing three dimensional circuit techniques such as might be used in a three-dimensional memory array structure. The circuitry 300D may be created on the substrate 305 with the FET 320D built conventionally and coupled to metal line 302D and metal test pad 301D.

Figure 4:
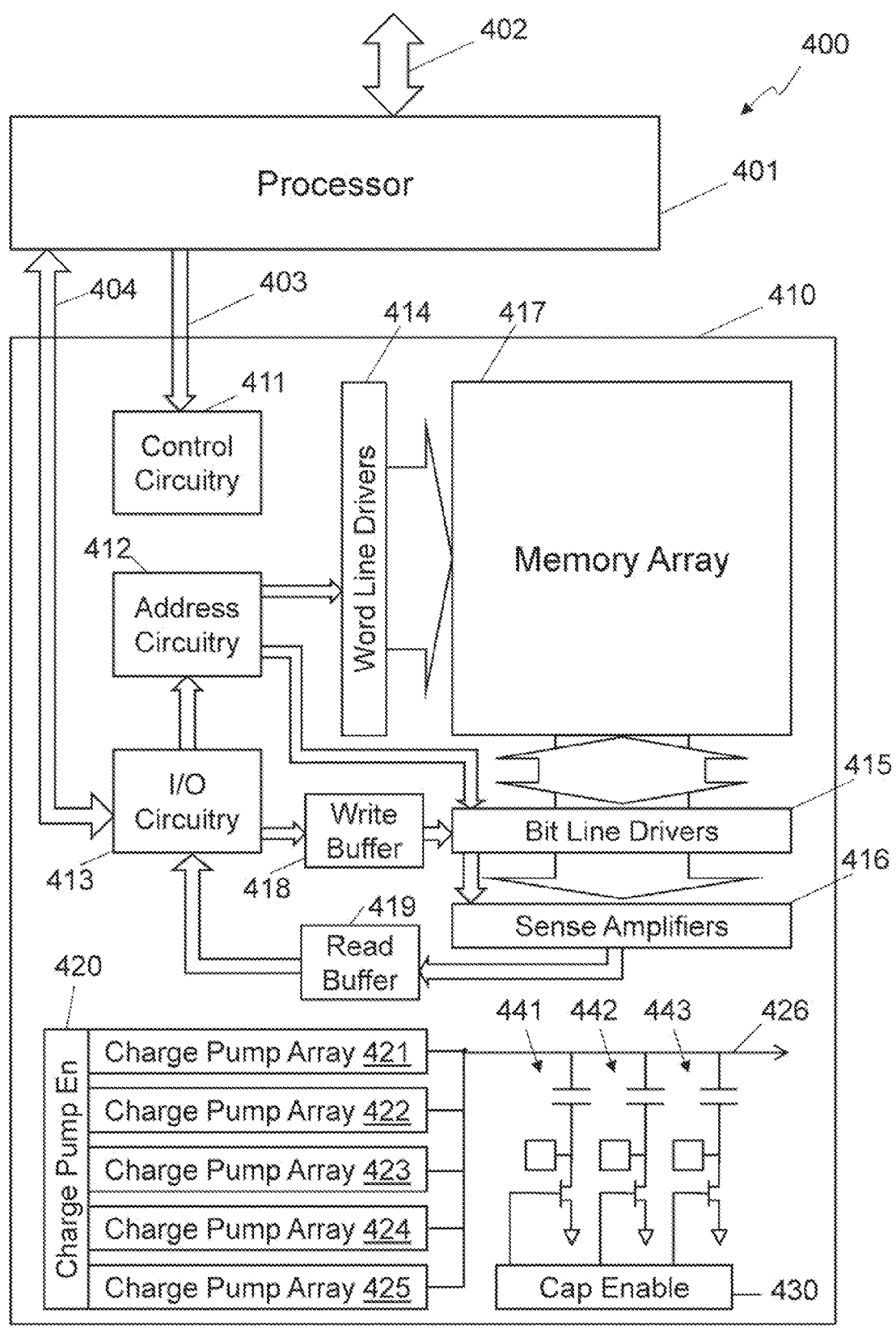
FIG. 4 is a block diagram of an embodiment of an electronic system including an IC with redundant charge pump arrays and redundant bypass capacitors.

The multi-layer capacitor 310D may include multiple layers of polysilicon and oxide. In the embodiment shown, polysilicon layer 351 is coupled to the source of FET 320C and test pad 301C. The output line 303D is coupled to polysilicon layer 359 constituting the other terminal of capacitor 310D. Polysilicon layers 333, 337, and 339 are left floating to increase time dependent dielectric breakdown (TDDB) by effectively increasing the thickness of the dielectric of the capacitor 310D. Oxide layers 352, 354, 356, 358 isolate the adjacent polysilicon layers FIG. 4 is a block diagram of an embodiment of an electronic system 400 including an IC, such as a memory device 410, with redundant charge pump arrays 421-425 and/or redundant bypass capacitors 441-443. A processor 401 is coupled to the memory device 410 with control/address lines 403 and data lines 404. In some embodiments, data and control may utilize the same lines. The processor 401 may be an external microprocessor, microcontroller, or some other type of external controlling circuitry. In some embodiments, the processor 401 may be integrated in the same package or even on the same die as the memory device 410. In some embodiments, the processor 401 may be integrated with the control circuitry 411, allowing some of the same circuitry to be used for both functions. The processor 401 may have external memory, such as random access memory (RAM) and read only memory (ROM), used for program storage and intermediate data or it may have internal RAM or ROM. In some embodiments, the processor may use the memory device 410 for program or data storage. A program running on the processor 401 may implement many different functions including, but not limited to, an operating system, a file system, bad cell or block mapping, and error management. The block diagram of computing or storage system 400 has been simplified to focus on features that are helpful in understanding this disclosure.

In some embodiments an external connection 402 is provided. The external connection 402 is coupled to the processor 401 and allows the processor 401 to communicate to external devices. If the electronic system 400 is a storage system, the external connection 402 may be used to provide an external device with non-volatile storage. The electronic system 400 may be a solid-state drive (SSD), a USB thumb drive, or any other type of storage system. The external connection 402 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If the electronic system 400 is a computing system, such as a mobile telephone, a tablet, a notebook computer, a set-top box, or some other type of computing system, the external connection 402 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)-Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 410 may include an array 417 of memory cells. The memory array 417 may be arranged in banks of word line rows and bit line columns. The memory array may also be arranged as stacks of memory cells, such as stacked NAND strings, Address lines and control lines 403 may be received and decoded by control circuitry 411, I/O circuitry 413 and address circuitry 412 which may control row circuitry 414 to control the word lines to the memory array 417 and column circuitry 415, 416 for the bit lines. I/O circuitry 413 may couple to the data lines 404 allowing data to be received from and sent to the processor 401. Sense circuitry 416 may be coupled to the memory array 417 and determine a logical state of selected memory cells and data read from the memory array 417 may be temporarily stored in read buffers 419. Data to be written to the memory array 417 may be temporarily stored in write buffers 418 before being transferred to the memory array 417.

Multiple charge pump arrays 421-425 may be included with design capability to provide more current than is used by the memory array 417. If one or more of the charge pump arrays 421-425 is defective, they may be disabled by the charge pump enable circuitry 420. Multiple bypass capacitors 441-443 may be included. If one or more of the bypass capacitors 441-443 is defective, it may be decoupled from the output of the charge pump arrays 426 by the capacitor enable circuitry 430.

The system illustrated in FIG. 4 has been simplified to facilitate a basic understanding of the features of the memory. Many different embodiments are possible including using a single processor 402 to control a plurality of memory devices 410 to provide for more storage space. Additional functions, such as a video graphics controller driving a display, and other devices for human oriented I/O may be included in some embodiments.

Figure 5:
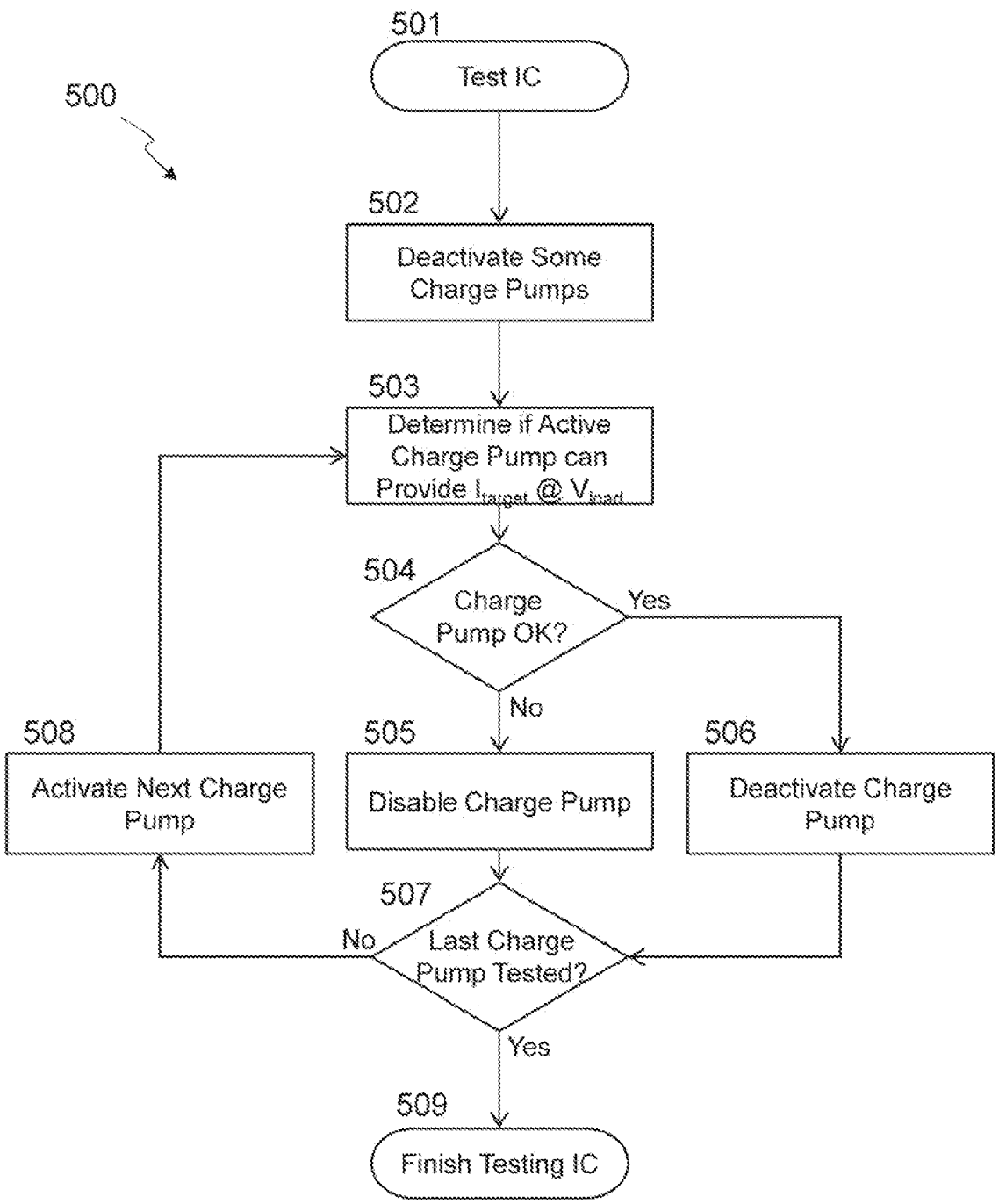
FIG. 5 is a flow chart of a method to test an IC.

FIG. 5 is a flow chart 500 of a method to test an IC, such as IC 100 of FIG. 1. Although the method may be useful for a variety of embodiments, IC 100 may be instructive in understanding the method and is used for illustrative purposes. Testing an IC 100 may begin at block 501. The method may be implemented using any combination of hardware circuitry, testing machines, dedicated computer systems, general purpose computers, firmware, software or any other way of implementing the method. Aspects of embodiments may take the form of a computer program product embodied in a computer readable medium or multiple computer readable media, having computer readable program code, or instructions, stored thereon. Any combination of one or more computer readable storage media may be utilized. A computer readable storage medium may be embodied as, for example, an electronic, magnetic, optical, electromagnetic, or semiconductor system, apparatus, or device, or other storage devices known to those of ordinary skill in the art, or any suitable combination of computer readable storage mediums. In the context of this document, a computer readable storage medium may be any tangible medium that can contain, or store a program and/or data for use by or in connection with an instruction execution system, apparatus, or device.

All but one charge pump array 121A-C may be deactivated at block 502. Various embodiments may deactivate at least one charge pump array of the group of two or more charge pump arrays 121A-C, as long as at least one active charge pump array is left active. Deactivating may be thought of as a temporary act affecting a charge pump array 121A-C during the testing process but not after that. Deactivation may be different than disabling in that disabling may impact the operation of the IC 100 after the testing process, such as during normal operation in an electronic system 400.

Various methods may be used to deactivate the at least one charge pump array, but for the IC 100, a tester may provide different voltages at test pads 134A-C. If a low level is applied to a test pad 134A-C, the respective charge pump array 121A-C is deactivated. If a high level is applied to a test pad 134A-C, the respective charge pump array 121A-C is active, as long as the respective fuse link 131A-C is intact.

Once at least one of the charge pump arrays 121A-C are deactivated, the method determines if the active charge pump arrays are operating properly. In the embodiment shown, the one active charge pump array 121A-C is tested to see if it can provide the target current at the load voltage at block 503. If more than one charge pump array 121A-C is active, the active charge pump arrays may be checked to determine if the active charge pump arrays can provide a current equal to the target current times the number of active charge pump arrays, at the load voltage. The tester may probe the test pad 122 which is coupled to the coupled outputs of the charge pump arrays 121A-C, and provide a current load equal to the target current times the number of active charge pump arrays at the test pad 122 while measuring the voltage at test pad 122. If the voltage is at least the load voltage, the active charge pump arrays may be operating properly and a decision on the next action to take is made in block 504, depending on whether or not the active charge pump arrays are operating properly.

If the active charge pump arrays are operating properly, the active charge pump arrays may be deactivated by the tester at block 506. If the active charge pump arrays are not operating properly, at least one of the active charge pump arrays is disabled at block 505. If only one charge pump array is active, that charge pump array is disabled. If more than one charge pump array is active, additional testing may be performed to determine which charge pump array is defective before a charge pump array is disabled.

The method used to disable the defective charge pump array 121B may vary depending on the embodiment of the IC 100, but in the example shown, a fuse link 131B may be blown, or made to be an open circuit, which may be referred to as setting the modifiable element. In other embodiments, the modifiable element may be modified for those charge pump arrays 121A-C that are enabled. The fuse link 131B may be blown in various ways, including, but not limited to, providing an overcurrent to the fuse link 131B, laser ablation of the fuse link 131B, mechanical separation of the fuse link 131B, or any other method of opening the fuse link 131B. If other types of modifiable elements are used, a technique appropriate for that modifiable element may be used to modify the particular element. For some types of modifiable elements, different actions may be taken to the modifiable elements that is different for enabled charge pump arrays than for those of disabled charge pump arrays, such as performing one of two different wire bonding operations.

Once the tested functional charge pump arrays are deactivated at block 506 or the defective charge pump array is disabled at block 505, it is determined whether the last charge pump array has been tested at block 507. If there are still untested charge pump arrays, another charge pump array is activated at block 508 and that charge pump array is tested at block 503 and disabled at block 505 it is defective. Once it is determined that the last charge pump array has been tested at block 507, additional testing may be performed to finish testing the IC at block 509.

In some embodiments, the integrated circuit may be failed by the testing process if a number of charge pump arrays that are disabled exceeds a predetermined number. This may be due to not having enough working charge pump arrays in the IC 100 to provide the load current at the load voltage. Some embodiments may include testing a memory array coupled to the coupled outputs of the charge pump arrays that are not disabled and the memory array may include a three-dimensional array of memory cells in some embodiments.

Some embodiments of the IC 100 may include redundant bypass capacitors 141A-C that may be multi-layer capacitors. The capacitance of the individual capacitors 141A-C may be may be tested in some embodiments by turning off FETs 155A-C by applying a low level to test pads 154A-C and then measuring the capacitance between ground and the respective test pad 142A-C. If one or more of the bypass capacitors 141A-C is defective, such as bypass capacitor 141A, the defective bypass capacitor 141A may be decoupled from the coupled outputs of the group of charge pump arrays by blowing the respective fuse link 151A, to decouple bypass capacitor 141A. If a number of capacitors that are decoupled exceeds a predetermined number the IC 100 may be failed by the testing process.

The flowchart 500 helps to illustrate the architecture, functionality, and operation of possible implementations of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart 500, and/or combinations of blocks, can be implemented by special purpose hardware-based systems that perform the specified functions or acts, or combinations of special purpose hardware and computer instructions.

Examples of various embodiments are described in the following paragraphs:

An example integrated circuit (IC) includes a circuit block to utilize a load current at a load voltage from a power input, two or more charge pump arrays having outputs coupled to the power input of the circuit block, and one or more modifiable elements to disable one or more of the two or more charge pump arrays. Some examples of the IC, the two or more charge pump arrays individually may be capable of providing at least a target current at the load voltage, and a combined current capability of the two or more charge pump arrays may exceed the load current by at least the target current. In some examples of the IC, at least one of the two or more charge pump arrays may be disabled. In some examples of the IC, the circuit block may include a three-dimensional array of memory cells. In some examples of the IC, the two or more charge pump arrays may include multi-layer capacitors. Some examples of the IC may include two or more multi-layer capacitors and one or more additional modifiable elements to determine whether one or more of the two or more multi-layer capacitors are coupled to the outputs of the two or more charge pump arrays. Any combination of the examples of this paragraph may be used in embodiments.

An example of a method to test an IC includes deactivating at least one charge pump array of a group of two or more charge pump arrays, leaving at least one active charge pump array. The two or more charge pump arrays have their outputs coupled together. The example of the method also includes determining whether a first current at a first voltage can be provided by the at least one active charge pump array, and disabling at least one of the at least one active charge pump arrays if the first current at the first voltage cannot be provided by the at least one active charge pump array. In some examples of the method the deactivating may leave a single charge pump array enabled, and the deactivating and determining may be repeated for one or more charge pump arrays in the group of two or more charge pump arrays. Some examples of the method may include failing the IC if a number of disabled charge pump arrays exceeds a predetermined number. Some examples of the method may include testing a three-dimensional array of memory cells coupled to the coupled outputs of the group of two or more charge pump arrays. In some examples of the method, the determining may include loading the coupled outputs of the group of two or more charge pump arrays with the first current, and measuring an output voltage at the coupled outputs of the group of two or more charge pump arrays to check whether the output voltage is at least as much as the first voltage. In some examples of the method, the disabling may include setting a modifiable element of the integrated circuit. In some examples of the method, the setting the modifiable element may include blowing a fuse link. Some examples of the method may include testing two or more multi-layer capacitors, and decoupling a capacitor of the two or more multi-layer capacitors from the coupled outputs of the group of charge pump arrays if the capacitor is defective. Some examples of the method may include failing the integrated circuit if a number of decoupled capacitors exceeds a predetermined number. Any combination of the examples of this paragraph may be used in embodiments.

An example of an electronic system includes a processor to generate memory control commands, and at least one memory, coupled to the processor, to respond to the memory control commands. The at least one memory includes a memory circuit to utilize a load current at a load voltage from a power input, two or more charge pump arrays having outputs coupled to the power input of the memory circuit, and one or more modifiable elements to disable one or more of the two or more charge pump arrays. In some examples of the electronic system, the memory circuit may include a three-dimensional array of memory cells. In some examples of the electronic system, the two or more charge pump arrays individually may be capable of providing at least a target current at the load voltage, and a combined current capability of the two or more charge pump arrays may exceed the load current by at least the target current. In some examples of the electronic system, at least one of the two or more charge pump arrays may be disabled. In some examples of the electronic system, the two or more charge pump arrays may include multi-layer capacitors. In examples of the electronic system, the memory may include two or more multi-layer capacitors, and one or more additional modifiable elements to determine whether one or more of the two or more multi-layer capacitors are coupled to the coupled outputs of the two or more charge pump arrays. Any combination of the examples of this paragraph may be used in embodiments.

An example of an integrated circuit includes means for deactivating at least one charge pump array of a group of two or more charge pump arrays, leaving at least one active charge pump array. The two or more charge pump arrays have their outputs coupled together. The example of the IC also includes means for determining whether a first current at a first voltage can be provided by the at least one active charge pump array, and means for disabling at least one of the at least one active charge pump arrays if the first current at the first voltage cannot be provided by the at least one active charge pump array. Some examples of the IC may include a three-dimensional array of memory cells coupled to the coupled outputs of the group of two or more charge pump arrays. In some examples of the IC, the means for determining may include means for loading the coupled outputs of the group of two or more charge pump arrays with the first current, and means for measuring an output voltage at the coupled outputs of the group of two or more charge pump arrays to check whether the output voltage is at least as much as the first voltage. Some examples of the IC may include two or more multi-layer capacitors, and means for decoupling a capacitor of the two or more multi-layer capacitors from the coupled outputs of the group of charge pump arrays if the capacitor is defective. Any combination of the examples of this paragraph may be used in embodiments.

An example of an embodiment includes at least one computer readable medium having instructions stored therein. The instructions, if executed on a machine, cause the machine to deactivate at least one charge pump array of a group of two or more charge pump arrays, leaving at least one active charge pump array. The two or more charge pump arrays have their outputs coupled together. In this example the instructions also cause the machine to determine whether a first current at a first voltage can be provided by the at least one active charge pump array, and disable at least one of the at least one active charge pump arrays if the first current at the first voltage cannot be provided by the at least one active charge pump array. In some examples of the at least one computer readable medium, the instructions which cause the machine to deactivate the at least one charge pump array may leave a single charge pump array enabled. In some examples of the at least one computer readable medium the instructions, which cause the machine to deactivate the at least one charge pump array and determine whether the first current at the first voltage can be provided, may be repeated for one or more charge pump arrays in the group of two or more charge pump arrays. Some examples of the at least one computer readable medium may include instructions that if executed on a machine cause the machine to fail the integrated circuit if a number of disabled charge pump arrays exceeds a predetermined number. Some examples of the at least one computer readable medium may include instructions that if executed on a machine cause the machine to test a three-dimensional array of memory cells coupled to the coupled outputs of the group of two or more charge pump arrays. In some examples of the at least one computer readable medium, the instructions, which cause the machine to determine whether the first current at the first voltage can be provided, may include instructions that if executed on a machine cause the machine to load the coupled outputs of the group of two or more charge pump arrays with the first current, and measure an output voltage at the coupled outputs of the group of two or more charge pump arrays to check whether the output voltage is at least as much as the first voltage. In some examples of the at least one computer readable medium, the instructions, which cause the machine to disable at least one of the at least one active charge pump arrays, may include instructions that if executed on a machine cause the machine to set a modifiable element of the integrated circuit. In some examples of the at least one computer readable medium, the instructions, which cause the machine to disable at least one of the at least one active charge pump arrays, may include instructions that if executed on a machine cause the machine to blow a fuse link. Some examples of the at least one computer readable medium, may include instructions that if executed on a machine cause the machine to test two or more multi-layer capacitors, and decouple a capacitor of the two or more multi-layer capacitors from the coupled outputs of the group of charge pump arrays if the capacitor is defective. Some examples of the at least one computer readable medium may include instructions that if executed on a machine cause the machine to fail the integrated circuit if a number of decoupled capacitors exceeds a predetermined number. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. An integrated circuit comprising:
   a circuit block to utilize a load current at a load voltage from a power input;

two or more charge pump arrays having outputs coupled to the power input of the circuit block;
two or more redundant bypass capacitors coupled to the outputs of the of the two or more charge pump arrays;
one or more modifiable elements to disable one or more of the two or more charge pump arrays; and
one or more modifiable elements to disable one or more of the two or more redundant bypass capacitors to provide a desired amount of bypass capacitance for one or more of the two or more charge pump arrays.

2. The integrated circuit of claim 1, wherein the two or more charge pump arrays individually are capable of providing at least a target current at the load voltage, and
wherein a combined current capability of the two or more charge pump arrays exceeds the load current by at least the target current.

3. The integrated circuit of claim 1, wherein at least one of the two or more charge pump arrays is disabled.

4. The integrated circuit of claim 1, wherein the circuit block comprises a three-dimensional array of memory cells.

5. The integrated circuit of claim 1, wherein the two or more charge pump arrays comprise multi-layer capacitors.

6. The integrated circuit of claim, 1 further comprising:
two or more multi-layer capacitors; and
one or more additional modifiable elements to determine whether one or more of the two or more multi-layer capacitors are coupled to outputs of the two or more charge pump arrays.

7. A method to test an integrated circuit comprising:
deactivating at least one charge pump array of a group of two or more charge pump arrays, leaving at least one active charge pump array, wherein the group of the two or more charge pump arrays have outputs coupled together;
determining whether a first current at a first voltage can be provided by the at least one active charge pump array, wherein said determining comprises testing two or more redundant bypass capacitors and disabling one or more of the two or more redundant bypass capacitors to provide a desired bypass capacitance for the at least one active charge pump array; and
disabling at least one of the at least one active charge pump arrays if the first current at the first voltage cannot be provided by the at least one active charge pump array.

8. The method of claim 7, wherein the deactivating leaves a single charge pump array enabled, and the deactivating and determining are repeated for one or more charge pump arrays in the group of two or more charge pump arrays.

9. The method of claim 8, further comprising failing the integrated circuit if a number of disabled charge pump arrays exceeds a predetermined number.

10. The method of claim 8, further comprising;
testing a three-dimensional array of memory cells coupled to the coupled outputs of the group of two or more charge pump arrays.

11. The method of claim 7, wherein the determining comprises:
loading the coupled outputs of the group of two or more charge pump arrays with the first current; and
measuring an output voltage at the coupled outputs of the group of two or more charge pump arrays to check whether the output voltage is at least as much as the first voltage.

12. The method of claim 7, wherein the disabling comprises setting a modifiable element of the integrated circuit.

13. The method of claim 12, wherein the setting the modifiable element comprises blowing a fuse link.

14. The method of claim 7, further comprising:
testing two or more multi-layer capacitors; and
decoupling a capacitor of the two or more multi-layer capacitors from the coupled outputs of the group of charge pump arrays if the capacitor is defective.

15. The method of claim 14, further comprising failing the integrated circuit if a number of decoupled capacitors exceeds a predetermined number.

16. An electronic system comprising:
a processor to generate memory control commands; and
at least one memory, coupled to the processor, to respond to the memory control commands, the at least one memory comprising:
a memory circuit to utilize a load current at a load voltage from a power input;
two or more charge pump arrays having outputs coupled to the power input of the memory circuit;
two or more redundant bypass capacitors coupled to the outputs of the of the two or more charge pump arrays;
one or more modifiable elements to disable one or more of the two or more charge pump arrays; and
one or more modifiable elements to disable one or more of the two or more redundant bypass capacitors to provide a desired amount of bypass capacitance for one or more of the two or more charge pump arrays.

17. The electronic system of claim 16, wherein the memory circuit comprises a three-dimensional array of memory cells.

18. The electronic system of claim 16, wherein the two or more charge pump arrays individually are capable of providing at least a target current at the load voltage, and
wherein a combined current capability of the two or more charge pump arrays exceeds the load current by at least the target current.

19. The electronic system of claim 16, wherein at least one of the two or more charge pump arrays is disabled.

20. The electronic system of claim 16, wherein the two or more charge pump arrays comprise multi-layer capacitors.

21. The electronic system of claim 16, the memory further comprising:
two or more multi-layer capacitors; and
one or more additional modifiable elements to determine whether one or more of the two or more multi-layer capacitors are coupled to the outputs of the two or more charge pump arrays.

22. An integrated circuit comprising:
means for deactivating at least one charge pump array of a group of two or more charge pump arrays, leaving at least one active charge pump array, wherein the group of the two or more charge pump arrays have outputs coupled together;
means for determining whether a first current at a first voltage can be provided by the at least one active charge pump array, wherein said means for determining comprises means for disabling one or more of two or more redundant bypass capacitors coupled to the outputs of the two or more charge pump arrays to provide a desired bypass capacitance for the at least one active charge pump array; and
means for disabling at least one of the at least one active charge pump arrays if the first current at the first voltage cannot be provided by the at least one active charge pump array.

23. The integrated circuit of claim 22, further comprising;
a three-dimensional array of memory cells coupled to the coupled outputs of the group of two or more charge pump arrays.

24. The integrated circuit of claim 22, wherein the means for determining comprises:
- means for loading the coupled outputs of the group of two or more charge pump arrays with the first current; and
- means for measuring an output voltage at the coupled outputs of the group of two or more charge pump arrays to check whether the output voltage is at least as much as the first voltage.

25. The integrated circuit of claim 22, further comprising;
- two or more multi-layer capacitors; and
- means for decoupling a capacitor of the two or more multi-layer capacitors from the coupled outputs of the group of charge pump arrays if the capacitor is defective.

* * * * *